United States Patent [19]
Kuo

[11] Patent Number: 4,479,203
[45] Date of Patent: Oct. 23, 1984

[54] ELECTRICALLY ERASABLE PROGRAMMABLE READ ONLY MEMORY CELL

[75] Inventor: Clinton C. K. Kuo, Austin, Tex.
[73] Assignee: Motorola, Inc., Schaumburg, Ill.
[21] Appl. No.: 321,855
[22] Filed: Nov. 16, 1981
[51] Int. Cl.³ .................. G11C 7/00; G11C 11/40
[52] U.S. Cl. .................. 365/218; 365/185; 357/23.5
[58] Field of Search .................. 365/185, 218; 357/23 VT

[56] References Cited

U.S. PATENT DOCUMENTS

| | | | |
|---|---|---|---|
| 3,728,695 | 4/1973 | Bentchkowsky | 365/185 |
| 3,825,946 | 7/1974 | Bentchkowsky | 365/185 |
| 4,099,196 | 7/1978 | Simko | 365/218 |
| 4,314,265 | 2/1982 | Simko | 365/185 |
| 4,375,087 | 2/1983 | Wanlass | 365/218 |

OTHER PUBLICATIONS

Giebel, "An 8K EEPROM Using the SIMOS Storage Cell," IEEE Journal of Solid-State Circuits, vol. SC-15, No. 3, 6/80, pp. 311-314.
Das Gupta et al, "Dual-Gate FAMOS Memory Cell," IBM Tech. Disc. Bul., vol. 17, No. 8, 1/75, p. 2266.

*Primary Examiner*—Stuart N. Hecker
*Attorney, Agent, or Firm*—James L. Clingan, Jr.

[57] ABSTRACT

An electrically erasable programmable read only memory (EEPROM) cell has a floating gate transistor and a select transistor in series. A control gate of the select transistor extends to an area which overlies an extended portion of a floating gate of the floating gate transistor to form an erase window so that the EEPROM cell can be erased by application of an erase signal to the control gate of the select transistor.

7 Claims, 7 Drawing Figures

| | BIT LINE | MEMORY CONTROL LINE | ADDRESS WORD LINE |
|---|---|---|---|
| PROGRAM | 15 | 25 | 25 |
| ERASE | 0 | 0 | 25 |
| READ | OUTPUT | 5 | 5 |

ELECTRICALLY ERASABLE PROGRAMMABLE READ ONLY MEMORY CELL

TECHNICAL FIELD

This invention relates, in general, to Electrically Erasable Programmable Read Only Memory (EEPROM) cells, and more particularly to EEPROM cells which function with a select transistor.

BACKGROUND ART

Conventional erasable programmable read only memory (EPROM) cells are floating gate transistors having a control gate, floating gate, and a channel between a source and a drain. EPROM cells are programmed by inducing a current across a channel then pulling hot electrons up to a floating gate by application of a positive voltage to a control gate and are erased by application of ultraviolet light. Various techniques using Fowler-Nordheim tunneling have been implemented for erasing such cells in order to obtain electrically erasable programmable read only memory (EEPROM) cells. Such an EEPROM cell typically has a select transistor in series with a floating gate transistor. The select transistor is necessary for addressing the EEPROM cell. Programming is achieved by inducing a current through the floating gate transistor then pulling hot electrons into the floating gate with the same technique as with EPROM cells. Erasing, which requires drawing the electrons out of the floating gate, has been achieved in two different ways. One approach is to apply an erase signal, a positive voltage, to the control gate of the floating gate transistor of sufficient strength to draw the electrons out of the floating gate to the control gate. The disadvantage of this approach is that an oxide layer between the floating gate and the channel must be relatively thin and the voltage applied to the control gate must be relatively large. Another approach has been to extend the floating gate to an area which is in proximity to a special conductor, distinct from the control gate of the floating gate transistor, so that application of an erase signal to the special conductor can draw the electrons from the floating gate through an erase window formed between the special conductor and the floating gate. The advantage of this approach is that the oxide layer between channel and floating gate need not be as thin and the erase signal need not be as high in voltage as in the first approach. Also, the erase window can be altered as to size, dielectric constant, and voltage required to induce tunneling. Because cells developed from the second approach require a special conductor for the erase signal, memory circuits having an array of such cells require an extra conductor for each row. The increased complexity is, of course, a disadvantage. A cell of the prior art which uses the second approach is described by Burkhard Geibel, "An 8 K EEPROM Using the SIMOS Storage Cell," IEEE Journal of Solid State Circuits, Vol. SC-15, No. 3, pp. 311-314.

SUMMARY OF THE INVENTION

An object of the invention is to provide an improved electrically erasable read only memory (EEPROM) cell.

Another object is to provide a two transistor EEPROM cell with a reduced number of control lines.

Yet another object is to provide an erase window for a floating gate transistor between a floating gate of the floating gate transistor and a control gate of a select transistor, and furthermore, to do so using a conventional process.

In accordance with a preferred embodiment of the invention, a two transistor EEPROM cell has a select transistor and a floating gate transistor in series. The select transistor has a control gate which extends to an area which overlies a floating gate of the floating gate transistor and is insulated therefrom. An erase window is thereby formed in an insulated region between the control gate of the select transistor and the floating gate. Application of an erase signal to the gate of the select transistor can cause the floating gate transistor to be in an erased state.

DESCRIPTION OF A PREFERRED EMBODIMENT

Figure 1:
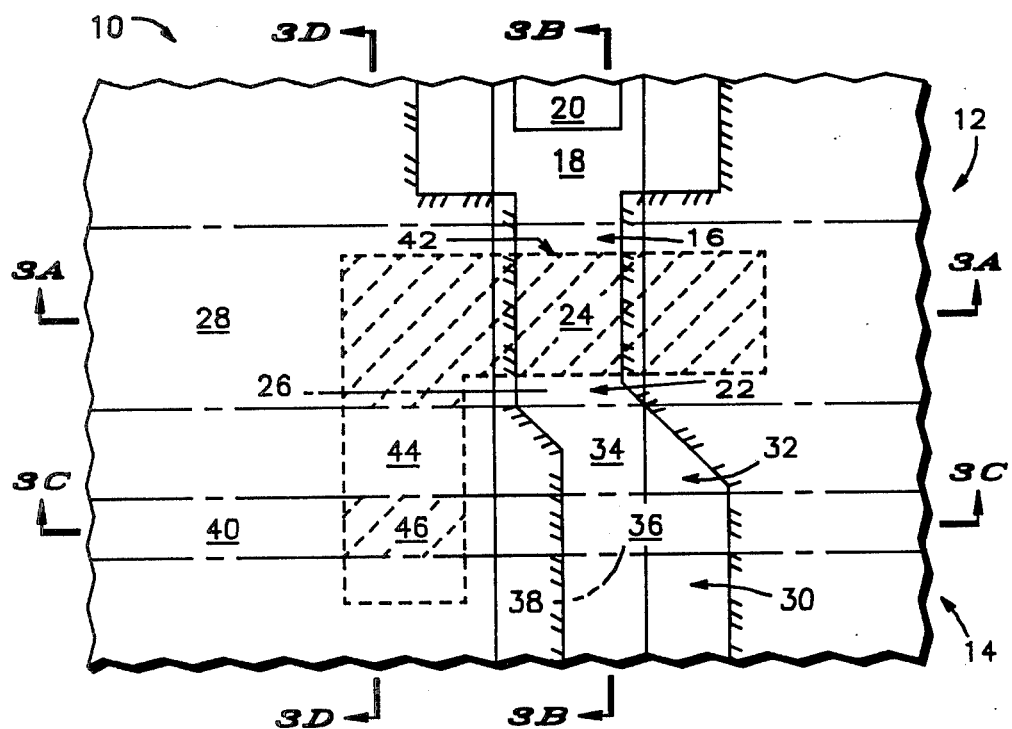
FIG. 1 is a top view of an electrically erasable programmable read only memory (EEPROM) cell of a preferred embodiment of the invention.
Figure 2:
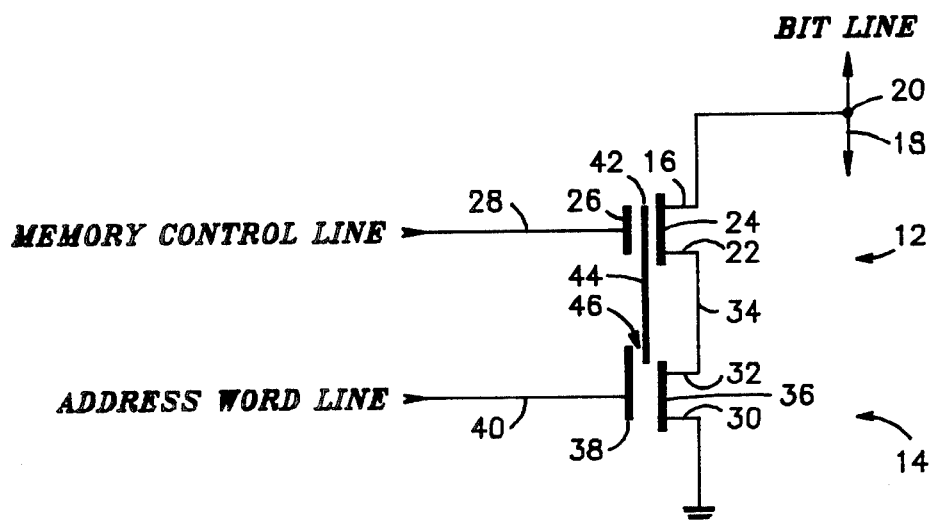
FIG. 2 is an electrical schematic diagram of the EEPROM cell of FIG. 1.

Shown in FIG. 1 is an electrically erasable programmable read only memory (EEPROM) cell 10 according to a preferred embodiment of the present invention. The same cell 10 is shown in schematic diagram form in FIG. 2 where the same reference numerals are used for the same elements. Cell 10 is comprised generally of a floating gate transistor 12 and a select transistor 14. Floating gate transistor 12 has a drain 16 connected to a meal bit line 18 at a metal contact 20, a source region 22, a channel region 24, and a control gate 26 which is part of a second level polysilicon line 28 which is functioning as a memory control line. Select transistor 14 has a source region 30 connected to a negative power supply shown as ground in FIG. 2, a drain region 32 connected to the source region 22 of the floating gate transistor 12 via common region 34, a channel region 36, and a control gate 38 which is a portion of a second level polysilicon line 40 which is functioning as an address word line. Floating gate transistor 12 also has a floating gate 42 which is a portion of a first level polysilicon segment 44. Second level polysilicon line 40, shown as an extended portion of control gate 38 in FIG. 2, overlies another portion of first level polysilicon segment 44 at an erase window 46.

FIGS. 3a-3d show the physical structure of cell 10 of FIG. 1 in more detail. Cell 10 is formed by a conventional process, in one face of a silicon semiconductor substrate 48 which is predominantly P type. A field oxide 50 borders transistors 12 and 14 and overlies P+ channel stop regions 52.

Figure 3A:
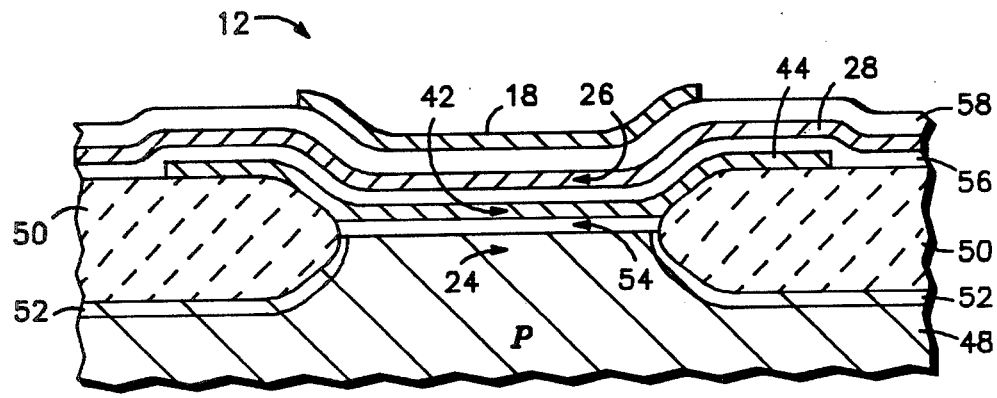
FIGS. 3a-3d are cross-sectional views of the EEPROM cell of FIG. 1 taken along lines a—a, b—b, c—c, and d—d, respectively.
Figure 3B:
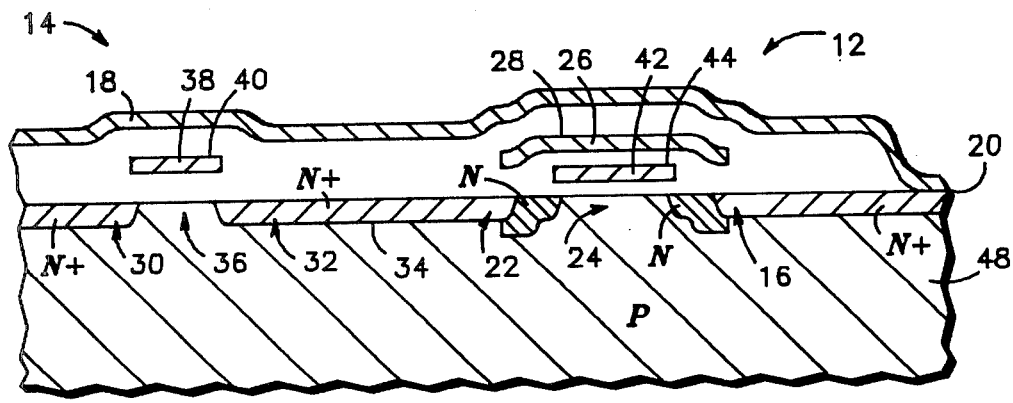
Figure 3C:
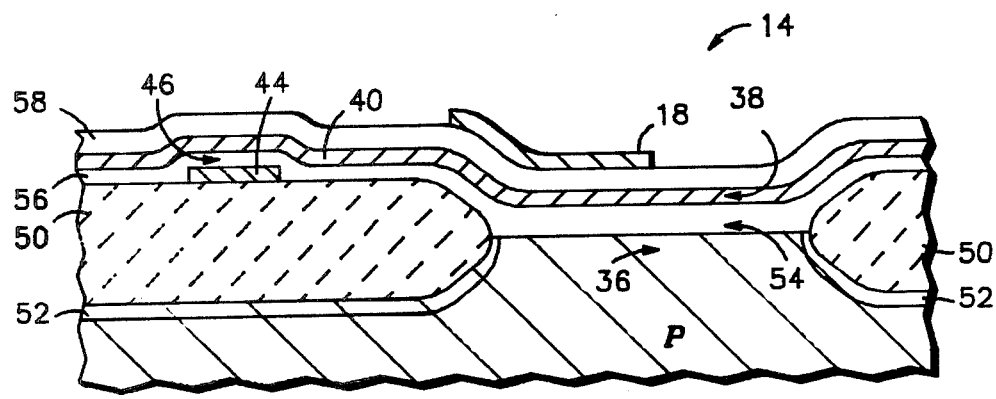
Figures 3D, 4:
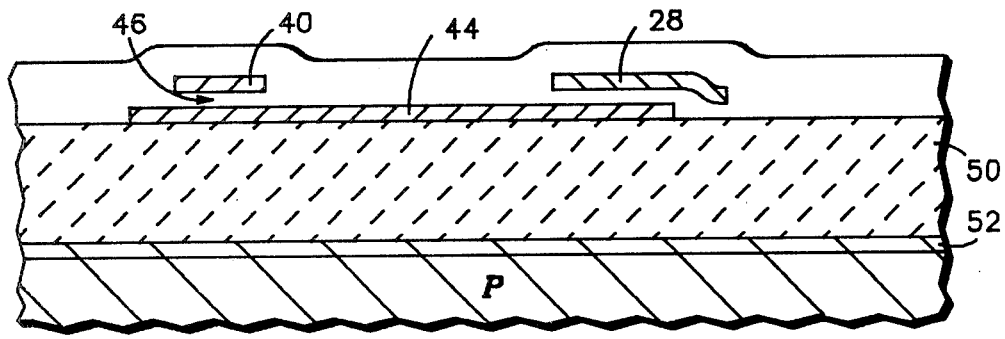
FIG. 4 is a table of voltages on electrodes of the EEPROM cell of FIG. 1 for various operating modes.

Floating gate 42 overlies channel 24 and is insulated therefrom by an oxide layer 54, for example 400-800 Angstroms thick. Control gate 26 overlies channel 24 are well as floating gate 42. Control gate 26 is insulated from floating gate 42 by an oxide layer 56, for example 500-1000 Angstroms thick. Metal line 18 overlies portions of second level polysilicon lines 28 and 40 and is insulated therefrom by oxide layer 58 of any conventional thickness. Control gate 38 overlies channel 36 and is insulated therefrom, by oxide layers 54 and 56, for example 700–1400 Angstroms thick. The extension of control gate 38, second level polysilicon line 40, overlies a portion of an extension of floating gate 42, first level polysilicon line 44, and is insulated therefrom by oxide layer 56 to form erase window 46. Erase window 46 is shown in FIGS. 3c and 3d as being formed between an extended portion of control gate 38 and an extended portion of floating gate 42, which is also a portion of first level polysilicon line 44.

Source region 30 and drain region 32 are formed to be N+ by any conventional means with channel 36 formed therebetween. Source region 22 and drain region 16 are formed to be N+ by any conventional means with channel 24 formed therebetween. Portions of source region 22 and drain region 16 nearest channel 24 are formed to be N by any conventional means. Drain region 32 and source region 22 are coupled together by virtue of each being formed in common with common region 34.

Cell 10, in a preferred form, is one cell at an intersection of a row and a column of an array of cells in a single semiconductor substrate. Metal bit line 18 extends as a column line to cells of other rows and is coupled to a sense amplifier via a column decoder. The Memory Control Line and the Address Word Line extend as a row line to cells of other columns and are responsive to a row decoder. In operation, cell 10 provides a logic "1" in a programmed state and a logic "0" in an erased state. In the programmed state, floating gate transistor 12 has a relatively high threshold voltage, in the order of 8 volts by virtue of the floating gate 42 having an excess of electrons. In the erased state, floating gate transistor 12 has a relatively low threshold voltage, near zero volts by virtue of removal of electrons from floating gate 42. To read the logic state of cell 10, select transistor 14 is enabled by a logic high, for example 5 volts applied to word address line 40. The memory control line is held at a voltage between the relatively high and relatively low threshold voltages of floating gate transistor 12, for example, 5 volts, so that floating gate transistor will be conducting in the erased state but not conducting in the programmed state. Consequently, there will be a current path to ground from metal bit line 18 if cell 10 is in the erased state, whereas there will still be no current path to ground if cell 10 is in a programmed state. Accordingly, a logic "1" is present if there is no current path to ground whereas a logic "0" can be detected if there is a current path to ground. In the preferred form, as shown in FIG. 1, channel 36 is moved to the right to ensure that the extended floating gate does not effect channel 36.

Cell 10 is programmed by drawing electrons into floating gate 24. Select transistor 14 is enabled by a high voltage, for example 25 volts, bit line 18 is brought to an intermediate voltage, for example 15 volts, and control gate 26 is brought to the high voltage. A channel current is thus induced through floating gate transistor 12 from which hot electrons are drawn to floating gate 42 because of the positive voltage on the control gate 26. This is a conventional way of programming a floating gate transistor.

Cell 10 is erased in a manner which is made possible by erase window 46. Bit line 18 and control gate 26 are held to ground while the high voltage is applied to control gate 38 as an erase signal. Electrons stored in the floating gate are consequently drawn through erase window 46 to control gate 38 by the erase signal. The condition for these modes of operation is summarized in FIG. 4.

Most of the voltage of the erase signal applied to control gate 38 is developed across erase window 46. First level polysilicon segment 44, of which a portion is floating gate 42 and of which a portion is the extension of floating gate 42 which forms erase window 46, has a certain amount of capacitance associated therewith. The primary capacitances are comprised of a capacitance C28 to second level polysilicon line 28, capacitance C24 to channel 24 and capacitance C40 to second level polysilicon line 40 at erase window 46. With all capacitances from first level polysilicon segment 44 being to ground except for capacitance C40, the expression for the voltage $V_{46}$ across erase window 46 is related to the voltage $V_{38}$ at control gate 38 as follows:

$$V_{46} = V_{38} \cdot \frac{C28 + C24}{C40 + C28 + C24}$$

Because C40 is small compared to the capacitance to ground, C28+C24, virtually all of the voltage $V_{38}$ applied to control gate 38 will be developed across erase window 46. Consequently, the voltage level $V_{38}$ of an erase signal need only be a few volts in excess of the voltage required across erase window 46 to induce Fowler-Nordheim tunneling to draw the electrons out of floating gate 42. With erase window 46 of oxide, of 500 to 1000 Angstroms, the required voltage across erase window 46 to induce tunneling is no more than 22 volts so that applying 25 volts to control gate 38 ensures cell 10 will be erased. Erase window 46 could also be altered by processing to have a lower required voltage for tunneling so that an even lower voltage could be used for erasing. The area in FIG. 1 which shows where second level polysilicon line 28 overlies first level polysilicon line 44 could have dimensions of 15×3.5 microns, the area where floating gate 42 overlies channel 24 could have dimensions of 5×3.5 microns, and the area where second level polysilicon line 40 overlies first level polysilicon line 44 to form erase window 46 could have dimensions of 3×3 microns. These dimensions of course can be varied as desired.

The largest capacitance is C28 because of the comparatively large area of first level polysilicon segment 44 which is covered by second level polysilicon line 28. This is an advantage of having an area for erasing which is remote from the control gate of the floating gate transistor. If the control gate of the floating gate transistor is used to draw the electrons from the floating gate, the floating gate has effectively only the channel capacitance to ground. In such cases the oxide between channel and floating gate must be minimized so as to maximize capacitance therebetween, and the voltage level applied as the erase signal must be larger. By using control gate 40 of select transistor 14 to provide for erasing cell 10 as well as for addressing cell 10, no extra conductor line is required for each row for carrying the erase signal.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. An electrically erasable programmable read only memory cell comprising:
   a floating gate transistor having source and drain regions formed in a face of a body of a semiconductor material with a channel region therebetween, a floating gate on said face having a first portion which overlies said channel region and is insulated therefrom, and a control gate overlying said first portion of the floating gate and insulated therefrom; and
   a control transistor having source and drain regions formed in said face with a channel region therebetween, and a control gate which overlies said channel region of said control transistor and is insulated therefrom;
   wherein the drain region of said control transistor is coupled to the source region of said floating gate transistor; and
   wherein the control gate of said control transistor extends over at least a second portion of said floating gate and is insulated therefrom to form an erase window.

2. The EEPROM cell of claim 1 constructed so that the sum of the capacitance between the floating gate and the control gate of said floating gate transistor and the capacitance between the floating gate and the channel region of the floating gate transistor is substantially larger than the capacitance between the control gate of said select transistor and the floating gate at the erase window.

3. The EEPROM cell of claim 2 wherein the control gate of said floating gate transistor overlies at least a third portion of the floating gate and wherein the sum of the areas of the first and third portions of the floating gate is substantially larger than the area of the second portion of the floating gate.

4. The EEPROM cell of claim 3 wherein said floating gate transistor is characterized as being in a programmed state when more than a predetermined number of electrons are present in the floating gate, and wherein upon application of an erase signal to the control gate of said select transistor electrons tunnel between the floating gate and the control gate of the select transistor at the erase window when said floating gate transistor is in a programmed state.

5. A method of erasing an electrically erasable programmable read only memory (EEPROM) cell having a floating gate transistor and a select transistor wherein the floating gate transistor has a control gate connected to a first signal line and characterized as having a first threshold voltage in an erased state; and a select transistor coupled in series with the floating gate transistor and having a control gate coupled to a second signal line; the method comprising:
   applying a first predetermined voltage to the control gate of the floating gate transistor; and
   applying an erase signal of a second predetermined voltage to the control gate of the select transistor, the second voltage being substantially larger than the first voltage.

6. An electrically erasable programmable read only memory (EEPROM) cell comprising:
   a floating gate transistor having a control gate connected to a first signal line and characterized as having a first threshold voltage in an erased state;
   a select transistor coupled in series with the floating gate transistor and having a control gate coupled to a second signal line; and
   erasing means for erasing the floating gate transistor in response to an erase signal being applied to the second signal line.

7. The EEPROM cell of claim 6 wherein the floating gate has a first electrode coupled to a column and a second electrode; and the select transistor has a first electrode coupled to the second electrode of the floating gate transistor, and a second electrode coupled to a negative power supply terminal.

* * * * *